United States Patent

Wei

[11] Patent Number: 6,049,383
[45] Date of Patent: Apr. 11, 2000

[54] ALIGNER DETECTOR INCLUDING AN ELECTROOPTIC MODULATOR FOR EACH DIFFRACTION ORDER

[75] Inventor: Chi-Hung Wei, Hsinchu, Taiwan

[73] Assignee: United Integrated Circuits Corp., Hsinchu, Taiwan

[21] Appl. No.: 09/191,912

[22] Filed: Nov. 13, 1998

[30] Foreign Application Priority Data

Aug. 18, 1998 [TW] Taiwan ................................. 87113555

[51] Int. Cl.[7] ........................................................ G01B 9/02
[52] U.S. Cl. ........................ 356/356; 356/363; 250/237 G; 250/559.3
[58] Field of Search .................................... 356/345, 356, 356/363, 400, 401; 250/237 G, 348, 559.3; 355/53

[56] References Cited

U.S. PATENT DOCUMENTS

| 4,771,180 | 9/1988 | Nomura | 250/548 |
| 5,285,259 | 2/1994 | Saitoh | 356/401 |

Primary Examiner—Samuel A. Turner
Attorney, Agent, or Firm—J. C. Patents; Jiawei Huang

[57] ABSTRACT

An improved aligner detector is provided. The improved aligner detector includes, a detector, several electrooptic modulators, and a refractor set, which includes several wedge patterns. Each of the electrooptic modulators includes a double-refraction transistor, which has a property of double refraction. By applying a special voltage on the double-refraction transistors, the double-refraction transistors can become transparent or opaque. Thereby, the electrooptic modulators can select a desired order of the diffraction light ray. The selected diffraction light ray is refracted by the refractor set to the detector for analysis.

12 Claims, 2 Drawing Sheets

ALIGNER DETECTOR INCLUDING AN ELECTROOPTIC MODULATOR FOR EACH DIFFRACTION ORDER

CROSS-REFERENCE TO RELATED APPLICATION

This application claims the priority benefit of Taiwan application serial no. 87113555, filed Aug. 18, 1998, the full disclosure of which is incorporated herein by reference.

BACKGROUND OF THE INVENTION

1. Field of the Invention

This invention relates to an apparatus used in semiconductor fabrication, and more particularly to an aligner detector, which uses an electrooptic modulator to select light with a specified light path.

2. Description of Related Art

A planarization technology in semiconductor fabrication is widely used to planarize an uneven surface of a wafer, resulting from various sub-structures formed on the wafer. After a planarization process, the wafer can have an even surface, which is very helpful to obtain precise fabrications for the subsequent fabrication processes, such as interconnect fabrication or pattern transfer. A chemical mechanical polishing (CMP) process is widely used in semiconductor fabrication to globally planarize the wafer surface. The CMP process may cause a zero mark on the wafer to be asymmetric. This results in an alignment error for each process. In order to obtain the alignment status, an aligner detector is used to analyze a diffraction light, which is a laser light beam diffracted by the zero mark.

FIG. 1 is schematic drawing of a conventional aligner detector. In FIG. 1, when a laser beam hits on a zero mark 10 at a desired location, the laser beam is diffracted into various individual diffraction light rays along different directions. The diffraction light rays pass through a wavy light refractor 12 and are refracted to a refractor set 20. The diffraction light rays travel in parallel after passing the wavy light refractor 12. According to the wavy structure, the diffraction light rays are assigned by an order number. The diffraction light rays 0, 1, and 7 are, for example, assigned as shown in FIG. 1. The higher order number means the farther diffracted. The refractor set 20 includes several wedge patterns with their fixed refraction angles, such as a wedge patter 20a and several wedge patterns 20b. The locations of the wedge patterns 10a, 20b are necessary to be properly matched to the diffraction light rays. For example, the wedge pattern 20a has a zero refraction and allows the diffraction light rays 0, 1 to pass. Each of the wedge patterns 20b has a certain refraction angle and is located at a position to receive a desired diffraction light ray, such as the diffraction light ray 7. The diffraction light rays again pass a wavy light refractor 14 and reach to a light detecting apparatus 30. The light detecting apparatus 30 includes a detector 30a, and several detectors 30b to receive the diffraction light rays. The detector 30a receives the diffraction light rays 0, 1, which are not refracted. The detectors 30b receive the other diffraction light rays, such as the diffraction light ray 7. After a proper arrangement the diffraction light rays with different light paths can reach to the detectors 30a, 30b.

For the conventional aligner detector described above, in order to detect the diffraction light rays of different orders, the light detector 30 has to include several sub-detectors 30a, 30b to detect some specified diffraction light rays. Since each detector has its different detector response, the measured signal of each detector is different. This may cause an alignment error. Moreover, each detector needs a calibration. The convention aligner detector including several detectors needs several calibrations. It is difficult to obtain a proper calibration.

In summary of above descriptions, the conventional aligner detector includes several detectors 30a, 30b. Since detector responses are different, the alignment error may occur due to an error analysis of detected signals of the detectors. It is difficult to properly calibrate the detectors. The fabrication cost is thereby increased.

SUMMARY OF THE INVENTION

It is therefore an objective of the present invention to provide an aligner detector, which uses an electrooptic modulator to select diffraction light rays of different order.

It is another an objective of the present invention to provide an aligner detector using only one detector to detect a selected diffraction light ray so that there is no problem of different detector response, which may causes an alignment error. Moreover, calibration of detector is easily done.

In accordance with the foregoing and other objectives of the present invention, an improved aligner detector is provided. The improved aligner detector includes, a detector, several electrooptic modulators, and a refractor set, which includes several wedge patterns. Each of the electrooptic modulators includes a double-refraction transistor, which has a property of double refraction. By applying a special voltage on the double-refraction transistors, the double-refraction transistors can become transparent or opaque. Thereby, the electrooptic modulators can select a desired order of the diffraction light ray. The selected diffraction light ray is refracted by the refractor set to the detector for analysis.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

The invention uses several electrooptic modulators to select one desired diffraction light ray with a specified light path. The invention also use only one light detector to detect the selected diffraction light ray so that there is no difficulty of calibration and problem of detector response.

Figure 1:
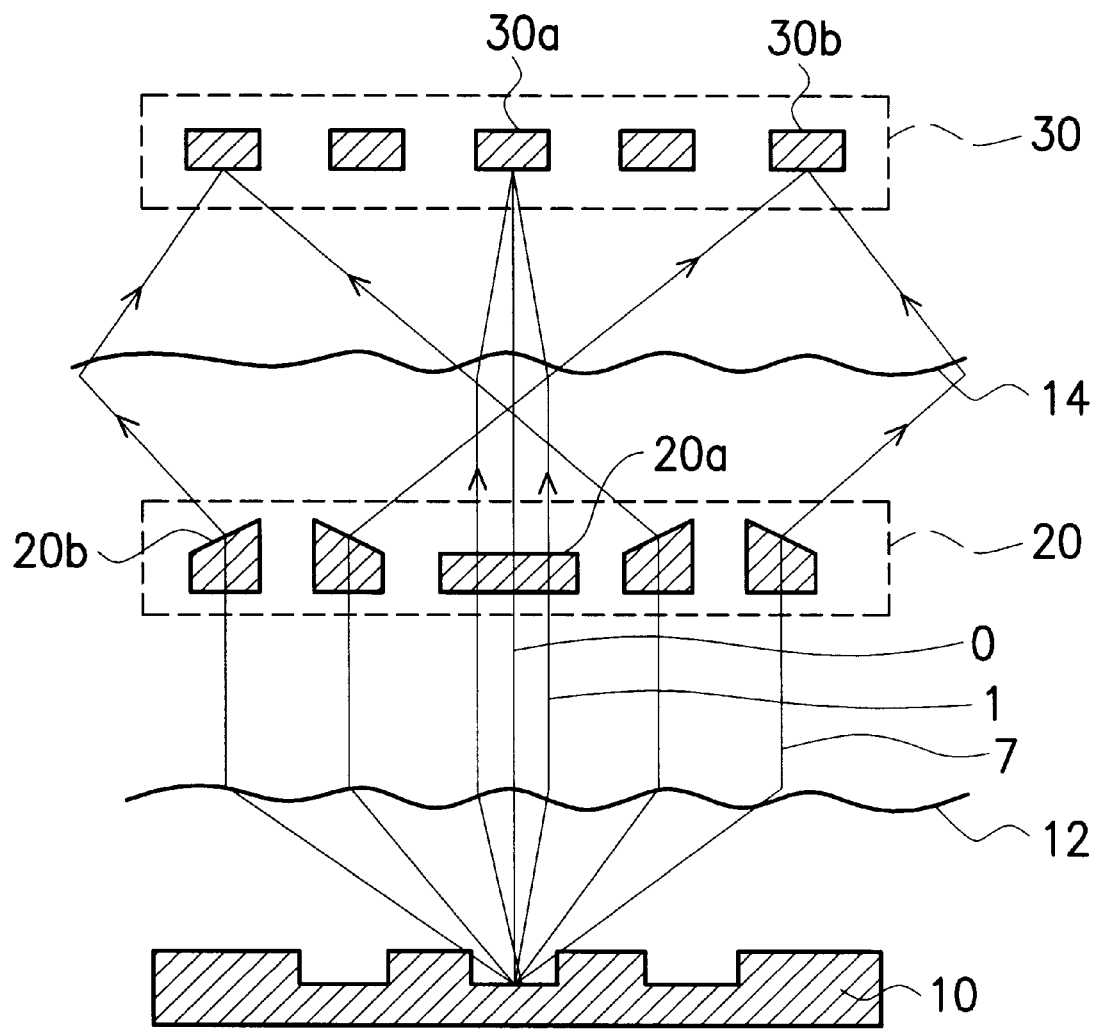
FIG. 1 is a schematic drawing of a conventional aligner detector.
Figure 2:
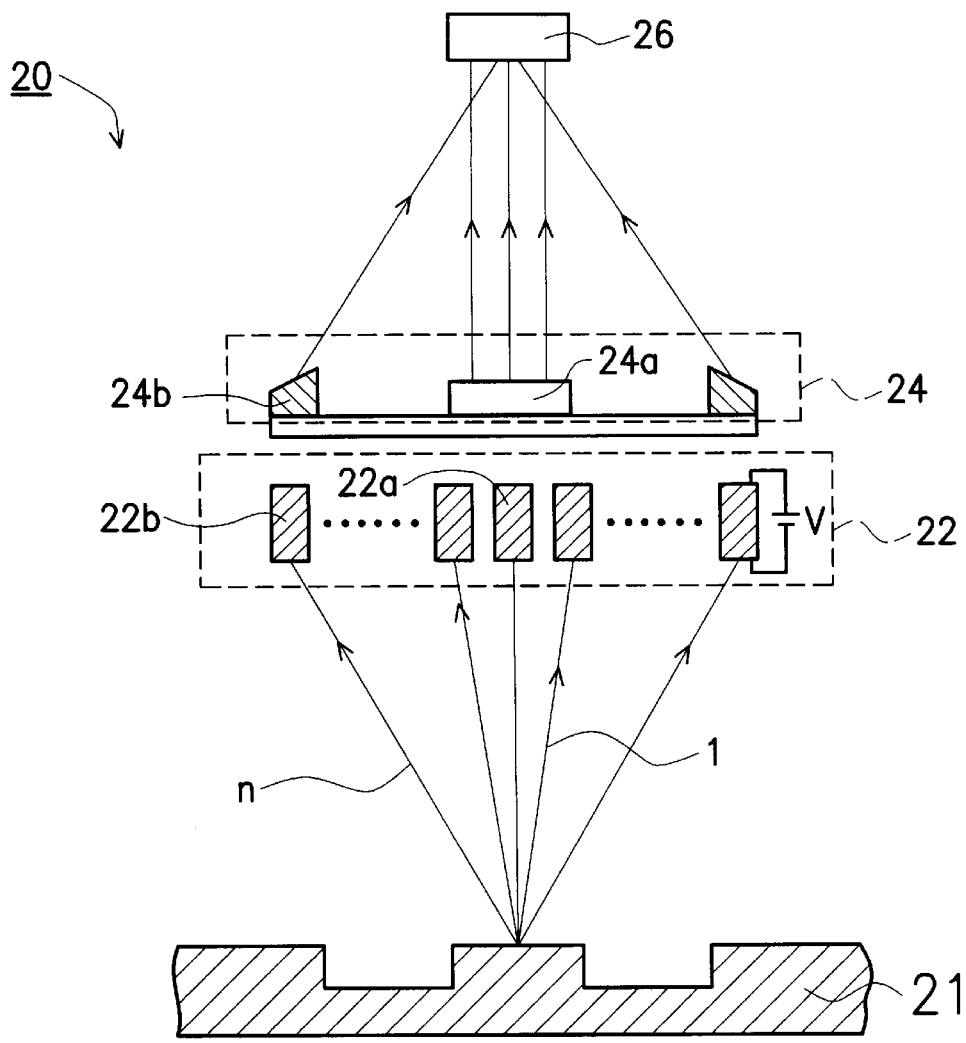
FIG. 2 is a schematic drawing of an improved aligner detector according to a preferred embodiment of the invention.

FIG. 2 is a schematic drawing of an improved aligner detector according to a preferred embodiment of the invention. When a laser beam hits on a zero mark 21 at a desired location, the laser beam is diffracted into various individual diffraction light rays 1, ... N along different directions. The zeroth order of the diffraction light ray is the one along a direction normal to a surface of the zero mark 21.

The improved aligner detector 20 includes at least an electrooptic modulator unit 22, a refractor unit 24, and a detector 26. The electrooptic modulator unit 22 includes a number of electrooptic modulators 22a, 22b. The refractor unit 24 includes a number of wedge patters 24a, 24b. Each of the electrooptic modulators 22a, 22b includes a controllable voltage V (only one, for example, shown). The on or off status of the controllable voltage V determines either the electrooptic modulators 22a, 22b is transparent or opaque so that the electrooptic modulator unit 22 can select the diffraction light rays 1, . . . N for pass. The zeroth order of the diffraction light ray passes the electrooptic modulator 22a and has no diffraction effect. A higher order of the diffraction light ray N means a more diffraction effect.

After the electrooptic modulator unit 22, the refractor unit 24 is used to refract the diffraction light rays 1 . . . n to the detector 26 by a number of wedge patterns 24a, 24b. The wedge pattern 24a does not refract the passed diffraction light rays. The wedge patterns 24b have an individual refraction surface with a proper tilted angle so as to refract the passed diffraction light ray to the detector 26 for detection and analysis. The wedge patterns 24b shown in FIG. 2 is just description. A full set of wedge patterns should be included to match with the electrooptic modulators 22a, 22b with a proper refraction angle.

Figure 3:
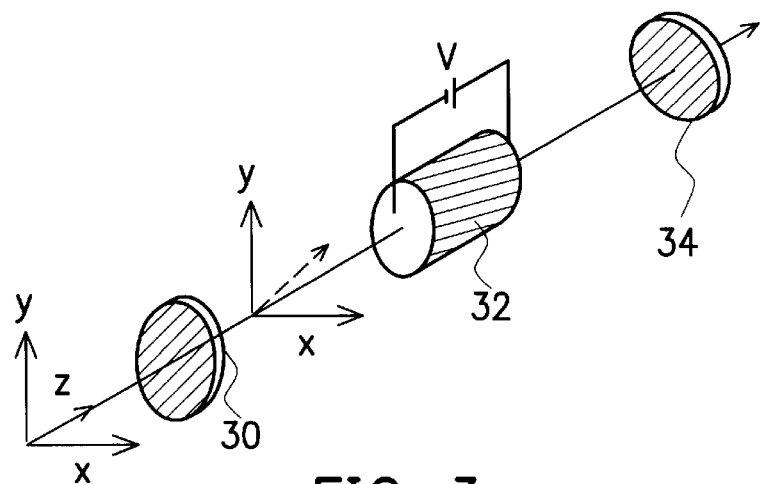
FIG. 3 is a perspective view of an electrooptic modulator schematically illustrating the performance of the electrooptic modulator of FIG. 2.

FIG. 3 is a perspective view of an electrooptic modulator schematically illustrating the performance of the electrooptic modulators of FIG. 2. In FIG. 3, an electrooptic modulator includes two polarization plates 30, 34, and an electrooptic body 32. The electrooptic body 32 includes, for example, a transistor with a property of double refraction. This transistor includes, for example, KDP, KD*P, LiNbO$_3$, LiTaO$_3$, GaAs, or CdTe. The electrooptic body 32 carries a controllable voltage V. The double refraction property of these material appears obviously when the controllable voltage V applies a voltage on it. This kind of transistor is called Pockel device.

The polarization plates 30, 34 are parallel and have 90 degree difference of polarization direction. When an incident light travels through the polarization plate 30 along the z-axis direction, the incident light is polarized in one direction. If there is no applied voltage on the electrooptic body 32, the electrooptic body 32 does not change the polarization direction. Hence, the incident light is polarized off by the polarization plate 34. If a voltage is applied on the electrooptic body 32, the electrooptic body 32 does change the polarization direction. The incident light can thereby pass the polarization plate 34. Therefore, the electrooptic modulator can be applied a voltage to allow the incident light to pass.

In conclusion, the invention uses the electrooptic modulator 22 to select a desired diffraction light ray from the zero mark 21. It is not necessary to select all diffraction light rays, most of which do not provide useful information for alignment.

Moreover, the invention includes only one detector so that there is no conventional difficulty of calibration and problem of detector response, which may cause an alignment error.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. An aligner detector used to detect a diffraction light from an object, the aligner detector comprising:

a plurality of electrooptic modulators, each of which comprises a controllable voltage to determine either the electrooptic modulator is transparent or opaque for the diffraction light;

a refractor unit, located after the electrooptic modulators, and used to refract a selected diffraction light passing through the electrooptic modulators; and a detector, used to receive and analyze the selected diffraction light refracted by the refractor unit.

2. The aligner detector of claim 1, wherein the object to produce the diffraction light comprises a zero mark used in semiconductor fabrication for a use of alignment.

3. The aligner detector of claim 1, wherein the detector comprises only one detector.

4. The aligner detector of claim 1, wherein the electrooptic modulators comprises a transistor, which has double refraction property.

5. The aligner detector of claim 4, wherein the transistor comprises KDP, KD*P, LiNbO$_3$, LiTaO$_3$, GaAs, or CdTe.

6. The aligner detector of claim 4, wherein each of the electrooptic modulators comprises a front polarization plate and a back polarization plate, in which the front polarization plate and the back polarization plate has 90 degrees of difference of polarization direction, and the transistor is between the front polarization plate and the back polarization plate.

7. The aligner detector of claim 1, wherein the refractor unit comprises a plurality of wedge patterns, each of which has a different refraction surfaces so as to individually refract the diffraction light to the detector.

8. An aligner detector used in a wafer alignment process, the aligner detector comprising:

a zero mark, which produces a diffraction light as a laser beam hits on it;

a plurality of electrooptic modulators, each of which comprises a controllable voltage to determine either the electrooptic modulator is transparent or opaque for the diffraction light;

a refractor unit, located after the electrooptic modulators, and used to refract a selected diffraction light passing through the electrooptic modulators; and one detector, used to receive and analyze the selected diffraction light refracted by the refractor unit.

9. The aligner detector of claim 8, wherein the electrooptic modulators comprises a transistor, which has double refraction property.

10. The aligner detector of claim 9, wherein the transistor comprises KDP, KD*P, LiNbO$_3$, LiTaO$_3$, GaAs, or CdTe.

11. The aligner detector of claim 8, wherein each of the electrooptic modulators comprises a front polarization plate and a back polarization plate, in which the front polarization plate and the back polarization plate has 90 degrees of difference of polarization direction, and the transistor is between the front polarization plate and the back polarization plate.

12. The aligner detector of claim 8, wherein the refractor unit comprises a plurality of wedge patterns, each of which has a different refraction surfaces so as to individually refract the diffraction light to the detector.

* * * * *